(12) United States Patent
Gipson

(10) Patent No.: US 10,564,341 B2
(45) Date of Patent: Feb. 18, 2020

(54) LIGHT GUIDE AND PRINTED CIRCUIT BOARD FILM POSITIONER

(71) Applicant: Dura Operating, LLC, Auburn Hills, MI (US)

(72) Inventor: Ron G. Gipson, Metamora, MI (US)

(73) Assignee: DURA OPERATING, LLC, Auburn Hills, MI (US)

( * ) Notice: Subject to any disclaimer, the term of this patent is extended or adjusted under 35 U.S.C. 154(b) by 39 days.

(21) Appl. No.: 15/852,427

(22) Filed: Dec. 22, 2017

(65) Prior Publication Data
US 2019/0196084 A1 Jun. 27, 2019

(51) Int. Cl.
| | |
|---|---|
| G02B 6/00 | (2006.01) |
| F21V 8/00 | (2006.01) |
| G02F 1/1335 | (2006.01) |
| H05K 3/28 | (2006.01) |
| G06F 3/041 | (2006.01) |

(52) U.S. Cl.
CPC ........... *G02B 6/0021* (2013.01); *G02B 6/006* (2013.01); *G02B 6/0031* (2013.01); *G02B 6/0065* (2013.01); *G02B 6/0091* (2013.01); *G02F 1/133605* (2013.01); *H05K 3/28* (2013.01); *G02B 6/0025* (2013.01); *G02B 6/0073* (2013.01); *G06F 3/041* (2013.01)

(58) Field of Classification Search
CPC .............................. G02B 6/0021; G02B 6/0091
See application file for complete search history.

(56) References Cited

U.S. PATENT DOCUMENTS

| | | | | |
|---|---|---|---|---|
| 8,077,272 | B2* | 12/2011 | Shimura | G02B 6/0016 349/65 |
| 9,841,553 | B2* | 12/2017 | Kim | G02B 6/0088 |
| 9,869,810 | B2 | 1/2018 | Keranen et al. | |
| 2005/0007515 | A1* | 1/2005 | Faris | G02B 6/0055 349/61 |
| 2007/0047255 | A1* | 3/2007 | Wang | G02B 6/0031 362/609 |

(Continued)

FOREIGN PATENT DOCUMENTS

| | | |
|---|---|---|
| WO | 2017077193 A1 | 5/2017 |
| WO | 2017178701 A1 | 10/2017 |

(Continued)

OTHER PUBLICATIONS

US 9,915,556 B2, 03/2018, Keränen et al. (withdrawn)

*Primary Examiner* — Julie A Bannan
(74) *Attorney, Agent, or Firm* — Vivacqua Law, PLLC

(57) ABSTRACT

A light guide assembly includes a metal material printed circuit board. A light emitting diode is mounted on and extends away from a first face of the printed circuit board. A light guide molded from a light transmissive polymeric material is positioned proximate to the light emitting diode and is at least partially received in a concomitantly shaped through bore pre-formed in the printed circuit board. The light guide includes an extended feature co-molded from the same material as the light guide and extending away from the first face of the printed circuit board in an installed position of the light guide. The extended feature includes a first extended feature having a first length and a second extended feature having a second length, the second length greater than the first length.

9 Claims, 4 Drawing Sheets

(56) References Cited

U.S. PATENT DOCUMENTS

| | | | |
|---|---|---|---|
| 2010/0321421 A1* | 12/2010 | Kee | G09G 3/3426 345/697 |
| 2015/0185395 A1* | 7/2015 | Chang | G02B 6/0031 362/606 |
| 2015/0308639 A1 | 10/2015 | Keranen et al. | |
| 2016/0295702 A1 | 10/2016 | Heikkinen et al. | |
| 2016/0345437 A1 | 11/2016 | Heikkinen et al. | |
| 2017/0082790 A1* | 3/2017 | Cho | G02B 6/003 |
| 2017/0192149 A1* | 7/2017 | Zhang | G02B 6/0021 |
| 2018/0224593 A1* | 8/2018 | Chu | G02B 6/00 |
| 2018/0267231 A1* | 9/2018 | Yeh | G02B 6/0073 |
| 2019/0064422 A1* | 2/2019 | Kim | G02B 6/0053 |

FOREIGN PATENT DOCUMENTS

| | | |
|---|---|---|
| WO | 2017178702 A1 | 10/2017 |
| WO | 2017178703 A1 | 10/2017 |

* cited by examiner

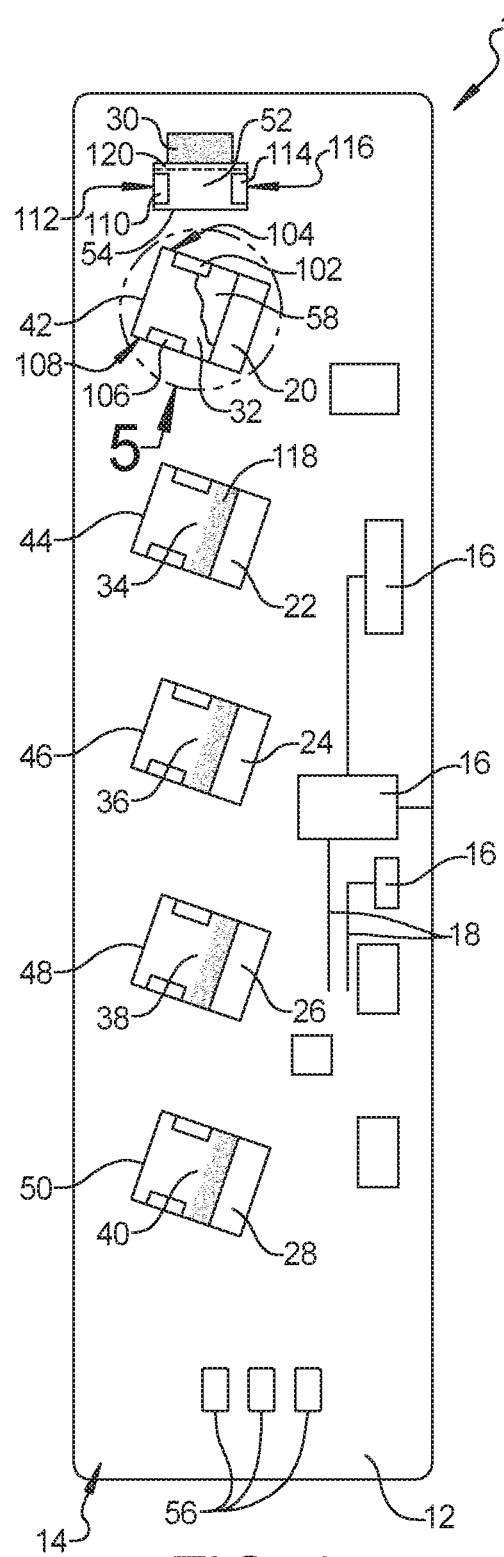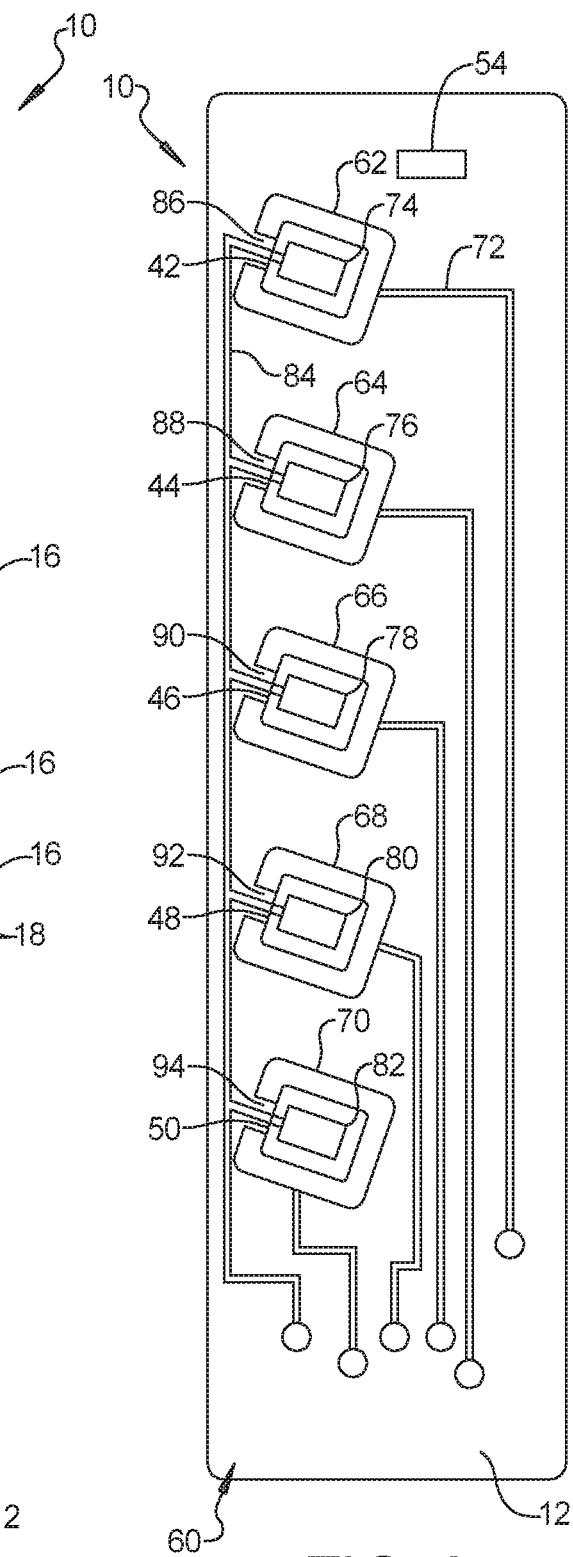

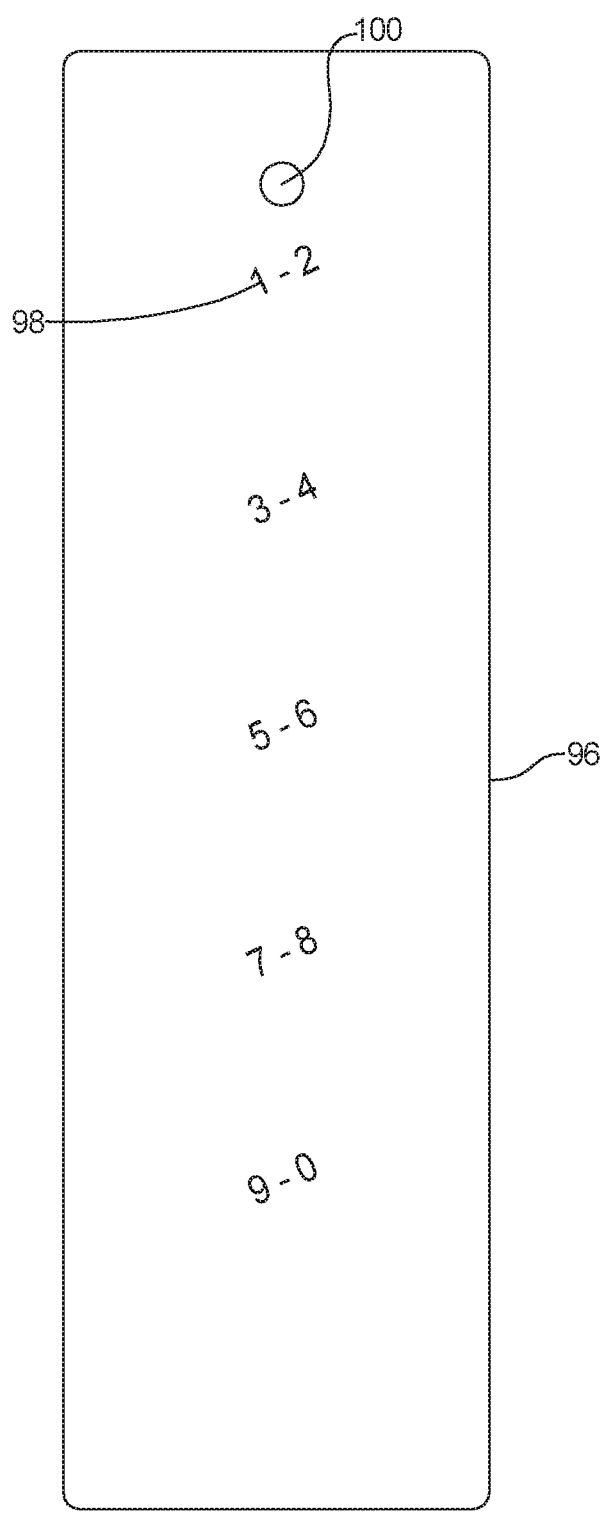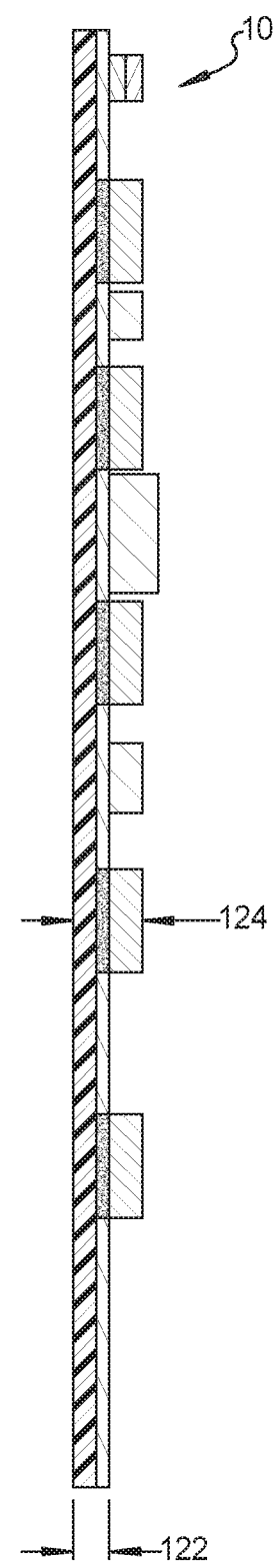
FIG. 3
FIG. 4

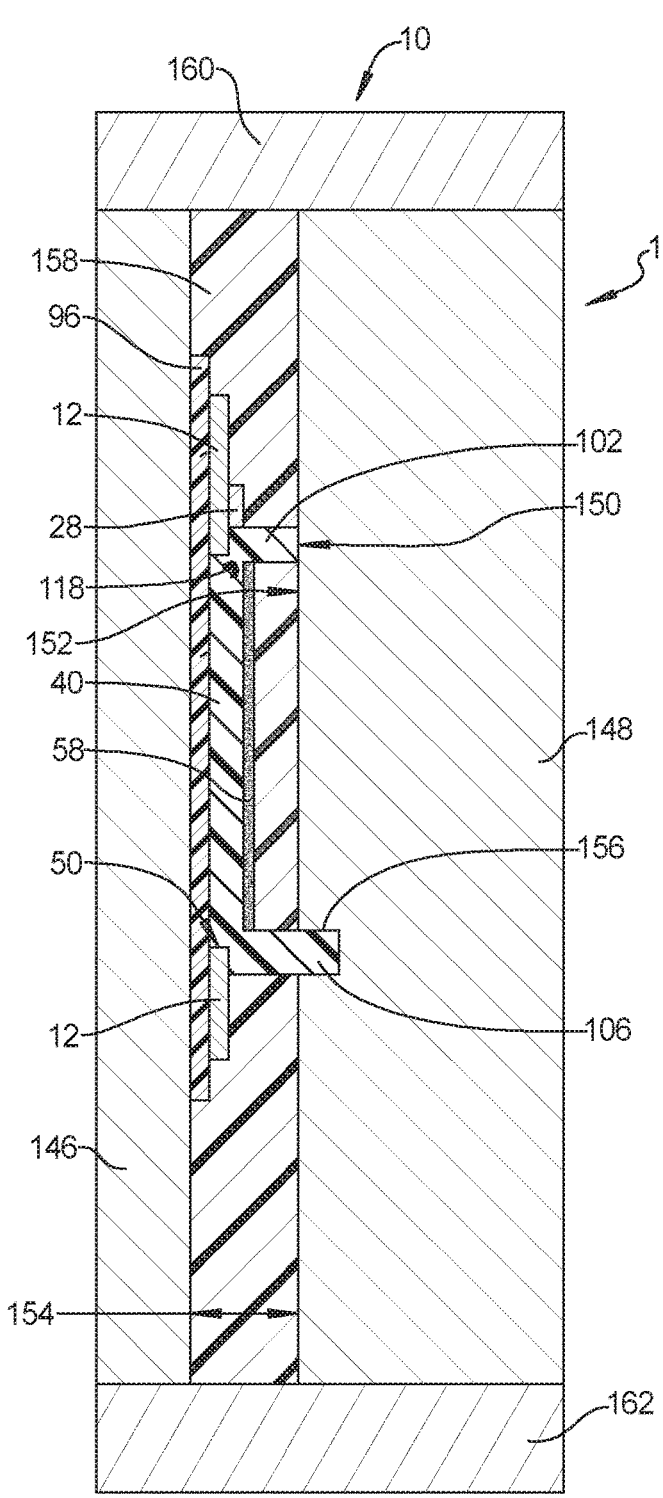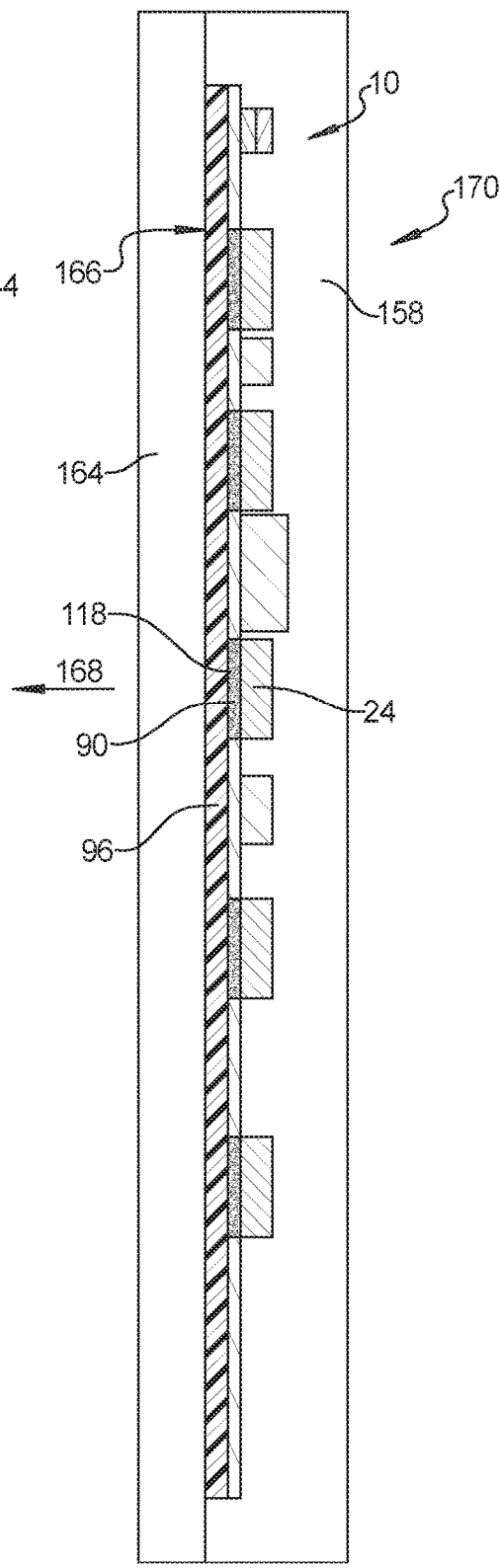
FIG. 7
FIG. 8

_US 10,564,341 B2_

LIGHT GUIDE AND PRINTED CIRCUIT BOARD FILM POSITIONER

FIELD

The present disclosure relates generally to the fabrication of printed circuit board parts with electronic components and particularly light guides embedded in a molded plastic.

BACKGROUND

The statements in this section merely provide background information related to the present disclosure and may or may not constitute prior art.

Electronic assemblies with backlit visual elements may be manufactured via several processes. Most commonly, a plastic part is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, insert the formed film into an injection mold having substantially the same shape, and then injection-mold plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronic components may also be printed onto a film. The film is then inserted into an injection mold, where plastic is molded onto the film, the electronic components being embedded in the molded plastic so that when the plastic part is removed from the mold the film is peeled away from the plastic part, leaving the electronic components embedded in or adhered to the surface of the plastic part.

Light emitted by the light source is commonly directed to the surface or area to be illuminated using a light guide positioned proximate to the light source. Known light guides are molded from a polymeric material different from a conformal coating, such as a clear or substantially clear plastic including polymethyl methacrylate (PMMA), a transparent thermoplastic often used as a glass substitute, or a polycarbonate polymer. The above methods of forming electronic assemblies having light guides may not accurately locate the light guide with respect to the light source during the molding and encapsulation process.

While current printed circuit board parts with electronic components including light guide components are satisfactory, this field can benefit from the improved film assembly and light guide with positioner of the present disclosure.

SUMMARY

According to several aspects, a light guide assembly includes a printed circuit board. A light emitting diode is mounted on a first face of the printed circuit board. A light guide molded from a light transmissive polymeric material is positioned proximate to the light emitting diode. The light guide includes an extended feature for positioning the light guide into a mold. The extended feature is co-molded from the same material as the light guide and extends away from the first face of the printed circuit board in an installed position of the light guide.

In another aspect of the present disclosure, the extended feature of the light guide includes: a first extended feature integrally connected to the light guide having a first length; and a second extended feature integrally connected to the light guide having a second length, the second length greater than the first length.

In another aspect of the present disclosure, the first extended feature is oriented parallel to and aligned with a first edge of the light guide. The second extended feature is oriented parallel to and aligned with a second edge of the light guide. The first extended feature abuts against a wall of the mold to set a thickness of an opaque polymeric material applied onto the first face of the printed circuit board during an injection molding process after installation of the light guide and the second extended feature is partially received within an aperture of the wall of the mold to position the light guide within the mold.

In another aspect of the present disclosure, the light guide includes a shoulder created in a first portion of the light guide, the shoulder supporting the light guide on the first face of the printed circuit board.

In another aspect of the present disclosure, a second portion of the light guide is received in a concomitantly shaped through bore pre-formed in the printed circuit board.

In another aspect of the present disclosure, a white film is applied or ink printed over the light guide.

In another aspect of the present disclosure, a touch capacitive circuit is printed on a second face of the printed circuit board oppositely directed with respect to the first face and connected to touch capacitive second electrical traces.

In another aspect of the present disclosure, a touch capacitive sensor connected to the touch capacitive circuit; and a window region unobstructed by direct through-passage of the electrical traces is maintained through the printed circuit board proximate to the touch capacitive sensor.

In another aspect of the present disclosure, a polymeric substantially opaque film is applied to the second face including onto the touch capacitive circuit, the second electrical traces, and the touch capacitive sensor. Light generated by the light emitting diode is blocked from passing through the opaque film except at a location of an indicia defining a light transparent portion of the opaque film.

In another aspect of the present disclosure, the light guide includes a texturally modified area proximate to the light emitting diode defining a light reflector to locally reflect light generated by the light emitting diode.

According to several aspects, a light guide assembly includes a metal material printed circuit board. A light emitting diode is mounted on and extends away from a first face of the printed circuit board. A light guide molded from a light transmissive polymeric material is positioned proximate to the light emitting diode and is at least partially received in a concomitantly shaped through bore pre-formed in the printed circuit board. The light guide includes an extended feature co-molded from the same material as the light guide and extending away from the first face of the printed circuit board in an installed position of the light guide. The extended feature includes a first extended feature having a first length and a second extended feature having a second length, the second length greater than the first length.

In another aspect of the present disclosure, the first extended feature is oriented parallel to and aligned with a first edge of the light guide.

In another aspect of the present disclosure, the second extended feature is oriented parallel to and aligned with a second edge of the light guide.

In another aspect of the present disclosure, the first extended feature is also oriented parallel to the second extended feature.

In another aspect of the present disclosure, a resin coating is applied onto the printed circuit board using an injection molding process after installation of the light guide. The first extended feature abuts against a wall of a mold to predetermine a thickness of the resin coating, and the second extended feature is partially received within an aperture of the wall of the mold to position the light guide within the mold.

In another aspect of the present disclosure, a white film is applied or ink printed over a surface of the light guide between the first extended feature and the second extended feature.

In another aspect of the present disclosure, a polymeric substantially opaque film is applied to a second face of the printed circuit board. Light generated by the light emitting diode is blocked from passing through the opaque film except at a location of an indicia defining light transparent portions of the opaque film.

According to several aspects, a light guide assembly includes a metal material printed circuit board. A light emitting diode is mounted on and extends away from a first face of the printed circuit board. A light guide pre-molded from a light transmissive polymeric material is positioned proximate to the light emitting diode, and is at least partially received in a concomitantly shaped through bore pre-formed in the printed circuit board. The light guide includes an extended feature co-molded from the same material as the light guide and extending away from the first face of the printed circuit board in an installed position of the light guide. The extended feature includes a first extended feature having a first length and a second extended feature having a second length, the second length greater than the first length. A white film is individually applied or ink printed over the light guide without contacting any portion of the first face of the printed circuit board. An opaque polymeric material is applied onto the first face of the printed circuit board using an injection molding process after installation of the light guide. The first extended feature abuts against a wall of a mold to predetermine a thickness of the opaque polymeric material, and the second extended feature is partially received within an aperture of the wall of the mold to position the light guide within the mold.

In another aspect of the present disclosure, the opaque polymeric material extends beyond a perimeter of the printed circuit board.

In another aspect of the present disclosure, a polymeric substantially opaque film is applied to a second face of the printed circuit board wherein light generated by the light emitting diode is blocked from passing through the opaque film except at a location of an indicia defining a light transparent portion of the opaque film. A substantially transparent layer of a polymeric material is applied onto the opaque film and onto a surface of the opaque polymeric material which is substantially co-planar with an outside face of the opaque film.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 1 is a top plan view of a first face of a light guide assembly according to an exemplary embodiment;

FIG. 2 is a bottom plan view of a second face of the light guide assembly of FIG. 1 prior to installation of an opaque film;

FIG. 3 is a plan view of an opaque film for application onto the second face of the light guide assembly of FIG. 2;

FIG. 4 is a side elevational view of the light guide assembly;

FIG. 7 is a cross sectional end elevational view of the light guide assembly of FIG. 1 at light guide 32, with the light guide assembly positioned in an injection mold; and FIG. 8 is a side elevational view of the light guide assembly of FIG. 4 after incorporation into a final assembly.

DETAILED DESCRIPTION

Figure 6:
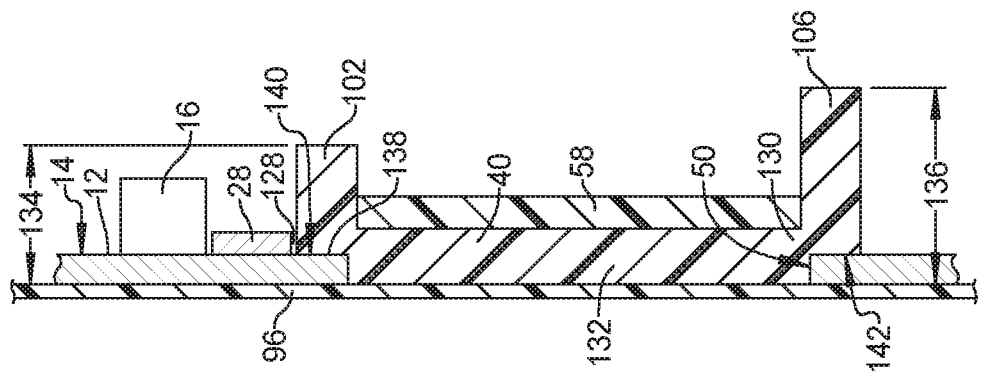
FIG. 6 is a cross sectional end elevational view taken at section 6 of FIG. 5.

The following description is merely exemplary in nature and is not intended to limit the present disclosure, application, or uses.

Referring to FIG. 1, a light guide assembly 10 includes a flexible material printed circuit board 12, made for example from a copper material or a polycarbonate material. According to several aspects, the printed circuit board 12 defines a rectangular shape. On a first side or face 14 of the printed circuit board 12 are located multiple electronic components 16 including capacitors, which are electrically connected to a plurality of first electrical traces 18 printed for example by a screen printing process onto the first face 14. Multiple light emitting diodes 20, 22, 24, 26, 28 are individually mounted on the first face 14. An additional light emitting diode 30 can optionally be provided at one end of the printed circuit board 12 to provide an illuminated indication that electrical power is available for the light guide assembly 10.

Figure 5:
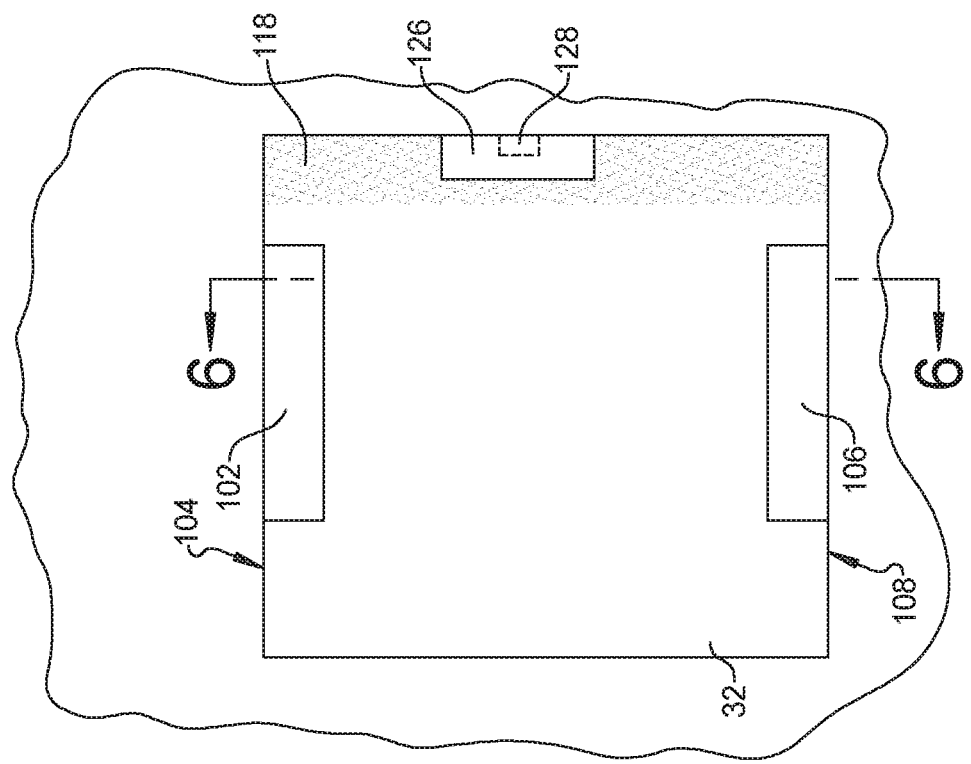
FIG. 5 is a top plan view of a light guide shown in area 5 of FIG. 1.

Positioned proximate to each of the light emitting diodes 20, 22, 24, 26, 28 and at least partially embedded in the printed circuit board 12 are individual light guides 32, 34, 36, 38, 40 each pre-molded for example from a substantially transparent or light transmissive polymeric material such as poly-methyl methacrylate (PMMA). A portion of each of the light guides 32, 34, 36, 38, 40 is received in a concomitantly shaped through bore 42, 44, 46, 48, 50 pre-formed in the printed circuit board 12, and is adhesively retained as will be described in greater detail in reference to FIG. 5. An additional light guide 52 is provided proximate to the optional light emitting diode 30 when provided, and is received in an opening 54.

Also positioned on the first face 14 of the printed circuit board 12 are a plurality of contact pads 56 which are connected to the electrical traces 18. According to several aspects, a white film 58, only a portion of one of which is shown for clarity, is individually applied or ink printed over each of light guides 32, 34, 36, 38, 40 and the light guide 52, without contacting any portion of the first face 14 of the printed circuit board 12, or any other component mounted to the first face 14. Each white film 58 further enhances light reflection in the individual light guides 32, 34, 36, 38, 40, 52 for light generated by the light emitting diodes 20, 22, 24, 26, 28, 30.

Referring to FIG. 2 and again to FIG. 1, on a second face 60 of the printed circuit board 12 oppositely directed with respect to the first face 14 are printed multiple touch capacitive circuits 62, 64, 66, 68, 70 which are connected to touch capacitive second electrical traces 72. The second electrical traces 72 are connected by apertures or vias extending through the printed circuit board 12 to the contact pads 56 positioned on the first face 14 of the printed circuit board 12. A touch capacitive sensor 74, 76, 78, 80, 82 is also positioned proximate to individual ones of the touch capacitive circuits 62, 64, 66, 68, 70, which are connected by electrical traces 84 to the contact pads 56.

A window region 86, 88, 90, 92, 94 unobstructed by direct through-passage of the electrical traces or the electrical components is maintained through the printed circuit board 12 proximate to each of the touch capacitive sensors 74, 76, 78, 80, 82, each aligned with one of the light guides 32, 34, 36, 38, 40. Each window region 86, 88, 90, 92, 94 permits a light generated by one of the light emitting diodes 20, 22, 24, 26, 28 and reflected through one of the light guides 32, 34, 36, 38, 40 to pass unobstructed through the printed circuit board 12 to locations of multiple indicia described in reference to FIG. 3. A separate window region of the printed circuit board 12 is also maintained through the printed circuit board 12 to allow light generated by the light emitting diode 30 and reflected by the light guide 52 to pass through the printed circuit board 12.

Referring to FIG. 3 and again to FIGS. 1 through 2, a polymeric substantially opaque film 96 is applied for example by adhesive bonding to the second face 60 including onto the touch capacitive circuits 62, 64, 66, 68, 70, the electrical traces 72, the touch capacitive sensors 74, 76, 78, 80, 82, and the electrical traces 84. According to several aspects, the opaque film 96 contains a black ink, rendering the opaque film 96 black in color. Light generated by any of the light emitting diodes 20, 22, 24, 26, 28, 30 of the printed circuit board 12 is blocked from passing through the opaque film 96 except at individual locations of multiple indicia 98. The indicia 98 are light transparent portions of the opaque film 96 which may be rendered as successive number pairs, and are each individually aligned with one of the window regions 86, 88, 90, 92, 94 where maximum light enhancement is achieved by the light guides 32, 34, 36, 38, 40, 52. A separate window region 100 can be provided through the opaque film 96 for light generated by the light emitting diode 30.

With continuing reference to FIG. 1, each of the light guides 32, 34, 36, 38, 40 and the light guide 52 include extended features which are co-molded from the same material as the light guides during molding of the light guides. The extended features act as locators to assist in subsequently locating individual light guides and positioning the light guides against material of the mold and to help set a thickness of a resin coating applied onto the printed circuit board 12 during the injection molding processes forming the light guide assembly 10 into a final assembly. The extended features also collectively assist in positioning the light guide assembly 10 within a mold.

The extended features of each of the light guides 32, 34, 36, 38, 40 are the same, therefore the following discussion of light guide 32 applies equally to light guides 34, 36, 38, 40. The light guide 32 includes a first extended feature 102 integrally connected to the light guide 32 and extending away from a light guide face directed toward the viewer as seen in FIG. 1, and therefore away from the first face 14 of the printed circuit board 12 in the installed position of the light guide 32. The first extended feature 102 has a first length and is oriented parallel to and is aligned with a first edge 104 of the light guide 32.

The light guide 32 further includes a second extended feature 106 integrally connected to the light guide 32 and extending away from the same light guide face as the first extended feature 102 and is directed toward the viewer as seen in FIG. 1, and is therefore directed away from the first face 14 of the printed circuit board 12 in the installed position of the light guide 32. The second extended feature 106 has a second length greater than the first length of the first extended feature 102 and is oriented parallel to and is aligned with a second edge 108 of the light guide 32. According to several aspects, the first extended feature 102 is also oriented parallel to the second extended feature 106.

The light guide 52 also provides extended features similar to the light guides 32, 34, 36, 38, 40. These include a first extended feature 110 oriented parallel to and aligned with a first edge 112 of the light guide 52. A second extended feature 114 is oriented parallel to and aligned with a second edge 116 of the light guide 52. According to several aspects, the first extended feature 110 is oriented parallel to the second extended feature 114. Similar to the light guide 32, a first length of the first extended feature 110 is less than a second length of the second extended feature 114.

With continuing reference to FIG. 1, each of the light guides 32, 34, 36, 38, 40, 52 also includes an area of the light guide having a "pebbled", texturally modified area or geometry proximate to each of the light emitting diodes 20, 22, 24, 26, 28. These pebbled, texturally modified areas each define a light reflector 118, which are features of the light guide itself created to locally enhance, reflect and scatter the light generated by the light emitting diodes 20, 22, 24, 26, 28. The texturally modified areas or light reflectors 118 are formed as texturally modified areas of portions of the light guide entirely within an envelope of each light guide, each proximate to one of the light emitting diodes 20, 22, 24, 26, 28. A separate light reflector 120 may also be provided in the light guide 52 positioned proximate to the light emitting diode 30, which is similar to the light reflectors 118 in design and function.

Referring to FIG. 4, when completed the printed circuit board 12 and the opaque film 96 of the light guide assembly 10 together have a thickness 122 of approximately 0.5 mm or less. A total thickness 124 of the light guide assembly 10 including the printed circuit board 12 and the opaque film 96 at the locations of each of the light emitting diodes 20, 22, 24, 26, 28 is approximately 1.0 mm or less. These thicknesses provide for maximum flexibility to allow conforming the light guide assembly 10 to a curved geometry for example of a trim component used in a motor vehicle "B" pillar.

Referring to FIG. 5 and again to FIGS. 1 through 4, each of the light guides 32, 34, 36, 38, 40, 52 can further include a recess or pocket 126 within the region defining the light reflector 118, or the light reflector 120. The pocket 126 is positioned to receive at least a portion of one of the light emitting diodes 20, 22, 24, 26, 28, or 30. This permits a lens 128 of each light emitting diode to be located within a thickness of the light guide and therefore more closely aligned with the light reflector 118, 120 for maximum light reflection into the proximate one of the light guides 32, 34, 36, 38, 40, or 52.

Referring to FIG. 6 and again to FIGS. 1 through 5, the following discussion of the light guide 40 applies equally to each of the other light guides 32, 34, 36, 38, 52. The white film 58 is individually applied or ink printed over the surface of the light guide 40 between the first extended feature 102 and the second extended feature 106. Where the second portion 132 of the light guide extends entirely through the printed circuit board 12, it contacts the opaque film 96 and may be retained by the adhesive present on the opaque film 96. As clearly evident in FIG. 6, a first length 134 of the first extended feature 102 is less than a second length 136 of the second extended feature 106 for reasons that will be described in greater detail in reference to FIG. 7.

According to several aspects the shoulder 138 created in the first portion 130 of the light guide 40 is supported directly on the first face 14 of the printed circuit board 12 while the second portion 132 is positioned within the through bore 50. The lens 128 of the light emitting diode 28 aligns with the texturally modified area defining one of the light reflectors 118 which is positioned proximate to the shoulder 138 of the light guide 40 extending above the first face 14 to maximize light reflection within the light guide 40.

The texturally modified area defining the light reflectors 118 is positioned proximate to the white film 58 to maximize light reflection into the through bores such as the through bore 50 created in the printed circuit board 12, allowing light generated by the light emitting diode 28 to pass through the second portion 132 of the light guide 40 within the through bore 50 and through the portion of the opaque film 96 shaped to define the indicia 98. This allows light from the light emitting diode 28 positioned proximate to the through bore 50 to pass through the opaque film 96.

According to several aspects, at least a width and according to several aspects both the width and a length of the first portion or shoulder 138 of the light guide 40 is larger than a width and length of the second portion 132 of the light guide 40 positioned within the through bore 50. The shoulder 138 therefore rests on a corner portion 140 of the first face 14 of the printed circuit board 12 such that a shoulder face 142 of the shoulder 138 contacts the corner portion 140. The shoulder 138 of the light guide 40 therefore both extends above the first face 14 and supports the light guide 40 on the first face 14 of the printed circuit board 12 in the installed position shown. The light guide 40 is therefore supported both by the opaque film 96 and the first face 14 of the printed circuit board 12.

Referring to FIG. 7 and again to FIGS. 1 through 6, the light guide assembly 10 is positioned in a mold 144. The mold 144 includes a tooling side first half 146 and an oppositely facing tooling side second half 148. The light guide assembly 10 is positioned having the opaque film 96 directly contacting the tooling side first half 146. An end face 150 of the first extended feature 102 of the light guide 40 having the first length 134 contacts an inside facing wall 152 of the tooling side second half 148 when the mold 144 is closed to create a spacing defining a cavity 154. The second extended feature 106 having the second length 136 which is greater than the first length 134 of the first extended feature 102 seats within a concomitantly shaped blind bore 156 created in the tooling side second half 148. Seating of the second extended feature 106 in the blind bore 156 fixes a 3-dimensional location of the light guide assembly 10 within the mold 144 and therefore, together with the seated second extending features of the remaining light guides 32, 34, 36, 38, 52, provides 3-dimensional X, Y, Z coordinate locations for the light guide assembly 10 when positioned in the mold 144.

A polymeric material such as acrylonitrile butadiene styrene (ABS) is injected into the cavity 154 which when solidified creates a non-light transparent or opaque layer 158 over the first face 14 and the components and features on the first face 14 and extends beyond a perimeter of the printed circuit board 12 of the of the light guide assembly 10. A portion of the coating opaque layer 158 also fills in the space between the first extended feature 102 and the second extended feature 106 between the white film 58 and the inside facing wall 152 of the tooling side second half 148. The clearance opening or through bore 50 is provided in the printed circuit board 12 providing the window region 86 described in reference to FIG. 2, for light generated by the light emitting diode 28 to pass through the light reflector 118 of the light guide 40 to the opaque film 96. The mold 144 may further include a first end wall 160 and an oppositely directed second end wall 162 that define ends of the cavity 154 and therefore define ends of the coating layer 158 as the polymeric material solidifies.

Referring to FIG. 8 and again to FIG. 7, the light guide assembly 10 having the coating layer 158 with a portion of the second extended feature 106 originally extending past the inside facing wall 152 of the tooling side second half 148 and into the blind bore 156 removed is then positioned in a second mold (not shown) wherein a clear or substantially transparent layer 164 of a polymeric material such as poly-methyl methacrylate (PMMA) is then injection molded onto the opaque film 96 and onto a surface 166 of the opaque layer 158 which is substantially co-planar with an outside face of the opaque film 96. The transparent layer 164 allows light transmission in a transmission direction 168 from light generated by any one of the light emitting diodes 20, 22, 24, 26, 28, 30 to be transmitted via the light guides 32, 34, 36, 38, 40, 52 through one of the light reflectors 118, 120 and through the transparent layer 164. A specific one of the light emitting diodes which is energized such as light emitting diode 28 back-illuminates a particular indicium such as the indicium 98 of one of the window regions such as the window region 94. A completed assembly 170 is created by the addition of the transparent layer 164.

A light guide assembly 10 of the present disclosure offers several advantages. These include the addition of different length extended features integrally provided with a light guide. A first extended feature having a first length provides for initial spacing within an injection mold to predetermine a polymeric material layer thickness. A second extended feature having a second length greater than the first length of the first extended feature provides for X, Y, Z alignment of the light guide within the mold.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A light guide and printed circuit board assembly, comprising:
   a printed circuit board;
   a light emitting diode mounted on a first face of the printed circuit board;
   a light guide molded from a light transmissive polymeric material positioned proximate to the light emitting diode, the light guide including an extended feature, the extended feature co-molded from the same material as the light guide and extending away from the first face of the printed circuit board in an installed position of the light guide; and a touch capacitive circuit printed on a second face of the printed circuit board oppositely directed with respect to the first face and connected to touch capacitive second electrical traces.

2. The assembly of claim 1, wherein the extended feature of the light guide includes:

a first extended feature integrally connected to the light guide having a first length; and a second extended feature integrally connected to the light guide having a second length, the second length greater than the first length.

3. The assembly of claim 2, wherein:

the first extended feature is oriented parallel to and aligned with a first edge of the light guide; and the second extended feature is oriented parallel to and aligned with a second edge of the light guide;

the first extended feature sets a thickness of an opaque polymeric material applied onto the first face of the printed circuit board after installation of the light guide.

4. The assembly of claim 1, wherein the light guide includes a shoulder created in a first portion of the light guide, the shoulder supporting the light guide on the first face of the printed circuit board.

5. The assembly of claim 4, wherein a second portion of the light guide is received in a concomitantly shaped through bore pre-formed in the printed circuit board.

6. The assembly of claim 1, further including a white film applied or ink printed over the light guide.

7. The assembly of claim 1, further including:

a touch capacitive sensor connected to the touch capacitive circuit; and a window region unobstructed by direct through-passage of the electrical traces maintained through the printed circuit board proximate to the touch capacitive sensor.

8. The assembly of claim 7, further including a polymeric substantially opaque film applied to the second face including onto the touch capacitive circuit, the second electrical traces, and the touch capacitive sensor, wherein light generated by the light emitting diode is blocked from passing through the opaque film except at a location of an indicia defining a light transparent portion of the opaque film.

9. The assembly of claim 1, wherein the light guide includes a texturally modified area proximate to the light emitting diode defining a light reflector to locally reflect light generated by the light emitting diode.

* * * * *